United States Patent [19]
Hotta

[11] Patent Number: 5,452,258
[45] Date of Patent: Sep. 19, 1995

[54] SEMICONDUCTOR READ ONLY MEMORY

[75] Inventor: Yasuhiro Hotta, Nara, Japan

[73] Assignee: Sharp Kabushiki Kaisha, Osaka, Japan

[21] Appl. No.: 105,016

[22] Filed: Aug. 10, 1993

[30] Foreign Application Priority Data

Aug. 31, 1992 [JP] Japan ................. 4-232467

[51] Int. Cl.⁶ ............................... G11C 7/00
[52] U.S. Cl. ................. 365/230.03; 365/200; 365/189.05; 365/230.08
[58] Field of Search ............ 365/185, 225.7, 200, 365/201, 230.03, 230.08, 189.05

[56] References Cited

U.S. PATENT DOCUMENTS

| | | | |
|---|---|---|---|
| 4,935,899 | 6/1990 | Morigami | 365/225.7 |
| 5,075,890 | 12/1991 | Itoh et al. | 365/185 |
| 5,132,933 | 7/1992 | Schreck et al. | 365/185 |
| 5,272,672 | 12/1993 | Ogihara | 365/200 |
| 5,278,794 | 1/1994 | Tanaka et al. | 365/200 |

Primary Examiner—David C. Nelms
Assistant Examiner—Tan Nguyen
Attorney, Agent, or Firm—Morrison & Foerster

[57] ABSTRACT

A semiconductor read only memory is disclosed. The memory has a memory cell array including a plurality of memory cell groups. Each of the plurality of memory cell groups includes a plurality of memory cells. The memory has select circuit for selecting an arbitrary memory cell group from among the plurality of memory cell groups, and an address storage circuit for storing address information of an arbitrary one of the memory cell groups; and a data storage circuit for storing data to be written into the arbitrary one of the memory cell groups.

12 Claims, 8 Drawing Sheets

SEMICONDUCTOR READ ONLY MEMORY

BACKGROUND OF THE INVENTION

1. Field of the Invention

The present invention relates to a semiconductor read only memory, particularly to a mask ROM (read only memory) into which information can be written at a fabrication stage.

2. Description of the Related Art

In recent years, semiconductor read only memories such as mask ROMs (Read Only Memories) have much finer device elements and larger memory capacity, and thus improvement in the production yield thereof becomes a prima issue. In order to improve the production yield, various structures of mask ROMs have been proposed so far.

One example is a mask ROM provided with an error-correcting circuit, which has already been put into practical use. A second example is a mask ROM provided with redundant memory cells, such as conventionally employed in a RAM (Random Access Memory), etc., for a memory cell column (row) arranged along a bit line (a word line). According to the second example, in cases where a defective memory cell is found in a memory cell array, the redundant memory cells are substituted for the memory cell column or row including the defective memory cell.

The mask ROM provided with the error-correcting circuit has an advantage that the time for dealing with and repairing the defective memory cell can be shorten, but has a disadvantage that the chip area is increased by 20% or more due to additional inclusion of the error-correcting circuit and memory cells for correcting any errors.

Moreover, such a mask ROM provided with the redundant memory cells cannot readily be put to practical use unlike a case of the RAM, etc, because not only address information but much more data information should be written into the mask ROM. In cases where several bits of memory cells show some defect, not only information of the defective memory cell but also that of normal memory cells connected to the same line to which the defective memory cell is connected should be written into each fuse element of the mask ROM.

Hereinafter, an exemplary structure of such a mask ROM will be described referring to FIG. 8, assuming that 1024 or more memory cells are connected to a common word line or bit line. As is shown in FIG. 8, the mask ROM comprises a sense amplifier 40, a row decoder 60, bit lines 90, a word line i, a selection circuit 50, a substitute address storage section 20, and a substitute data storage section 21. In cases where a defective memory cell is connected to the word line i, address information to specify the word line i is written into the substitute address storage section 20 provided with a plurality of fuse elements (not shown) by disconnecting prescribed fuse elements with radiation from laser light. Furthermore, information from all the memory cells (1024 or more memory cells) including the defective memory cell, connected to the word line i, is written into the substitute data storage section 21 provided with a plurality of fuse elements (not shown) by disconnecting prescribed fuse elements with radiation from laser light. As a result, if the memory cell connected to the word line i is accessed, a signal output from the substitute address storage section 20 is activated. Accordingly, the information stored in the substitute data storage section 21 is output via the selection circuit 50.

According to such a mask ROM, many fuse elements are inevitably disconnected with radiation from laser light, thereby substantially increasing the time needed for dealing with the laser light. Furthermore, the production yield cannot practically be improved because the percentage of success of the disconnection by laser light is decreased or the like. In cases where the source or drain of a transistor included in the memory cell array shows a defect, it often occurs that the other memory cells connected to the bit line to which the transistor is connected cannot be read out correctly.

SUMMARY OF THE INVENTION

The semiconductor read only memory of this invention comprises a memory cell array including a plurality of memory cell groups, said plurality of memory cell groups each including a plurality of memory cells; a select means for selecting an arbitrary memory cell group from among said plurality of memory cell groups; an address storage means for storing address information of an arbitrary one of the memory cell groups; and a data storage means for storing data to be written into said arbitrary one of the memory cell groups.

According to another aspect of the present invention, the semiconductor read only memory comprises: a memory cell array including a plurality of memory cell banks, said memory cell array comprising a plurality of first bit lines made of impurity diffusion layers and a plurality of second bit made of metal layers, said plurality of memory cell banks each including a plurality of memory cell MOS transistors provided between two adjacent first bit lines, portions of the respective two adjacent first bit lines forming source/drain regions for said plurality of MOS transistors; a select means for selecting an arbitrary memory cell bank from among said plurality of memory cell banks by interconnecting the first bit lines to the second bit lines; an address storage means for storing the address information of an arbitrary one of the memory cell banks; and a data storage means for storing data to be written into said arbitrary one of the memory cell banks.

According to yet another aspect of the present invention, the semiconductor read only memory comprises: a memory cell array including a plurality of memory cell banks, each of said plurality of memory cell blocks comprising a memory cell column constituted by a plurality of memory cells connected in series and a plurality of bit lines connected to the memory cell column; and select means for selecting an arbitrary memory cell bank among said plurality of memory cell blocks by interconnecting the bit line to the memory cell column; an address storage means for storing address information of an arbitrary one of the memory cell banks; and a data storage means for storing data to be written into said arbitrary one of the memory cell banks.

In one embodiment, the address storage means has a plurality of fuse elements to be disconnected by laser light or electrical means, and stores address information in accordance with the conductive or non-conductive state of each fuse element.

In one embodiment, the data storage means has a plurality of fuse elements to be disconnected by laser light or electrical means, and stores data in accordance with the conductive or non-conductive state of each fuse element.

In one embodiment, the address storage means has a plurality of fuse elements to be disconnected by laser light or electrical means, and stores address information in accordance with the conductive or non-conductive state of each fuse element; and the data storage means has a plurality of fuse elements to be disconnected by laser light or electrical means, and stores data in accordance with the conductive or non-conductive state of each fuse element.

Thus, the invention described herein makes possible the advantage of providing a semiconductor read only memory improved in production yield without enlarging the chip area nor increasing the time needed for dealing with defective memory cells.

This and other advantages of the present invention will become apparent to those skilled in the art upon reading and understanding the following detailed description with reference to the accompanying figures.

DESCRIPTION OF THE PREFERRED EMBODIMENTS

The present invention will be described by way of illustrating examples referring to figures.

Figure 1:
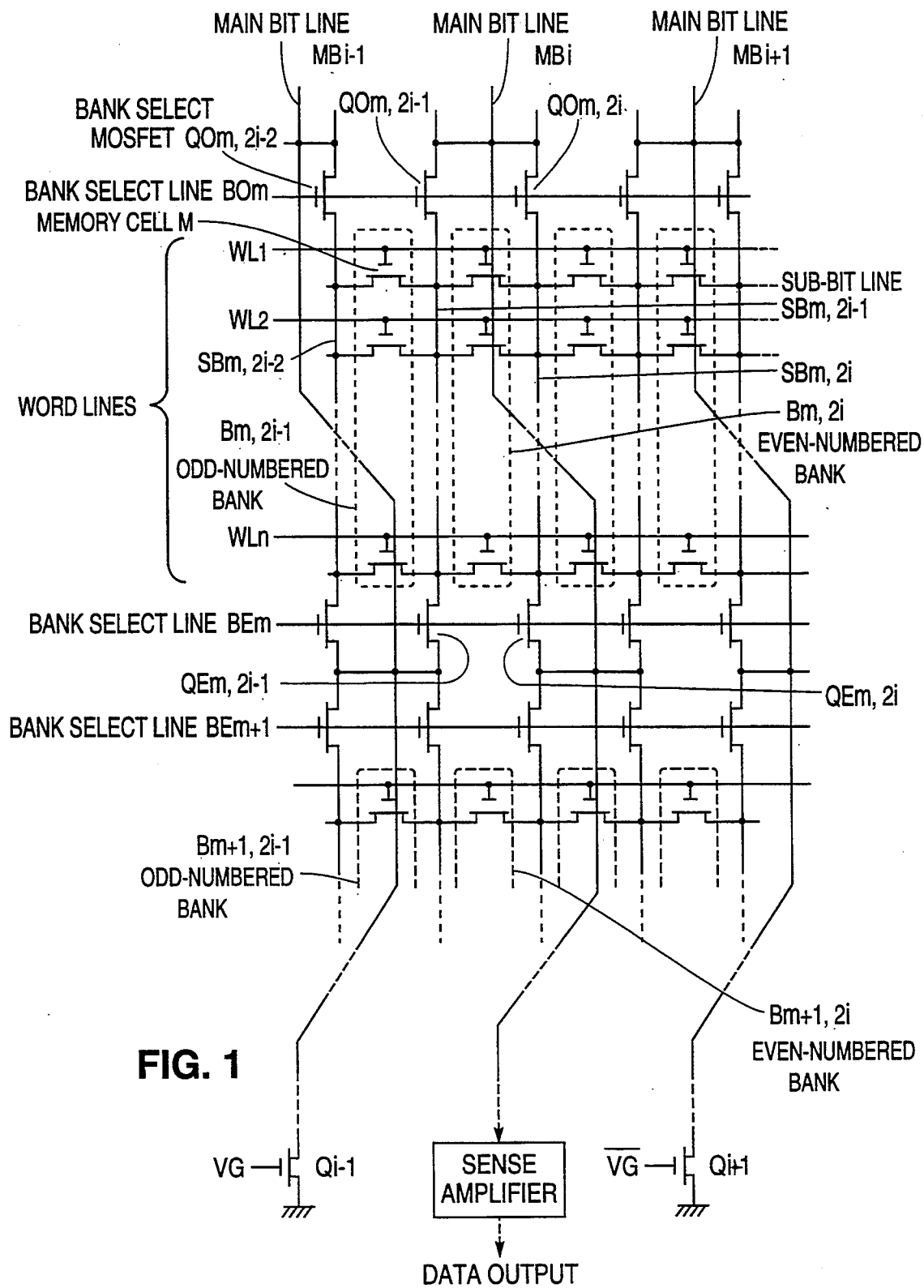
FIG. 1 shows a structure for a memory cell array of a semiconductor read only memory according to an example of the present invention.

FIG. 1 shows a structure for a memory cell array of a semiconductor read only memory according to an example of the present invention. The memory cell array comprises a plurality of memory cell blocks (hereinafter, referred to as "banks") shown in broken lines in FIG. 1: odd-numbered banks $B_{m,2i-1}$, $B_{m+1,2i-1}$, ..., etc. and even-numbered banks $B_{m,2i-1}$, $B_{m+1,2i}$, ..., etc. In each bank, a plurality of memory cells are arranged in a column direction. Between the odd-numbered banks ($B_{m,2i-1}$, ..., etc.) and the even numbered banks ($B_{m,2i}$, ..., etc.) arranged in a row direction, there are formed sub-bit lines (first bit lines) $SB_{m, 2i-2}$, $SB_{m, 2i-1}$, $SB_{m, 2i}$, ..., etc. made of a diffused layer. The sub-bit lines are each connected to the memory cells M included in each bank.

Main bit lines (second bit lines) $MB_{i-1}$, $MB_i$, ..., etc. each extend along the column direction and made of a metal layer with low-resistance. Two adjacent sub-bit lines are connected to a common main bit line via two adjacent bank select MOSFETs (transfer gate transistors), respectively. For example, sub-bit lines $SB_{m,2i-1}$ and $SB_{m, 2i}$ are connected to a main bit line $MB_i$ through bank select MOSFETs $QO_{m,2i-1}$ and $QO_{m, 2i}$, respectively.

The gates of the bank select MOSFETs $QO_{m, 2i-2}$, $QO_{m, 2i-1}$, $QO_{m, 2i}$, ..., etc. are each connected to a bank select line $BO_m$. The gate of each memory cell (transistor) is connected to a word line ($WL_1$, ..., or $WL_n$). Furthermore, the sub-bit lines $SB_{m, 2i-2}$, $SB_{m, 2i-1}$, $SB_{m, 2i}$, ..., etc. are connected to bank select MOSFETs $QE_{m, 2i-2}$, $QE_{m, 2i-1}$, $QE_{m, 2i}$, ..., etc., respectively. The gates of the bank select MOSFETs $QE_{m, 2i-1}$, $QE_{m, 2i}$, ..., etc. are each connected to a bank select line $BE_m$. The main bit lines $MB_{i-1}$, $MB_i$, ..., etc. are each connected to sense amplifiers and to GND via transistors $Q_{i-}$, $Q_{i+1}$, ..., etc., respectively.

Thus, the memory cell array of the present example is divided into a plurality of banks, and the plurality of banks each have a plurality of memory cells. According to such a memory cell array, in cases where some defect occurs in a diffused layer constituting a sub bit line, only memory cells connected to the diffused layer will become defective.

Figure 2:
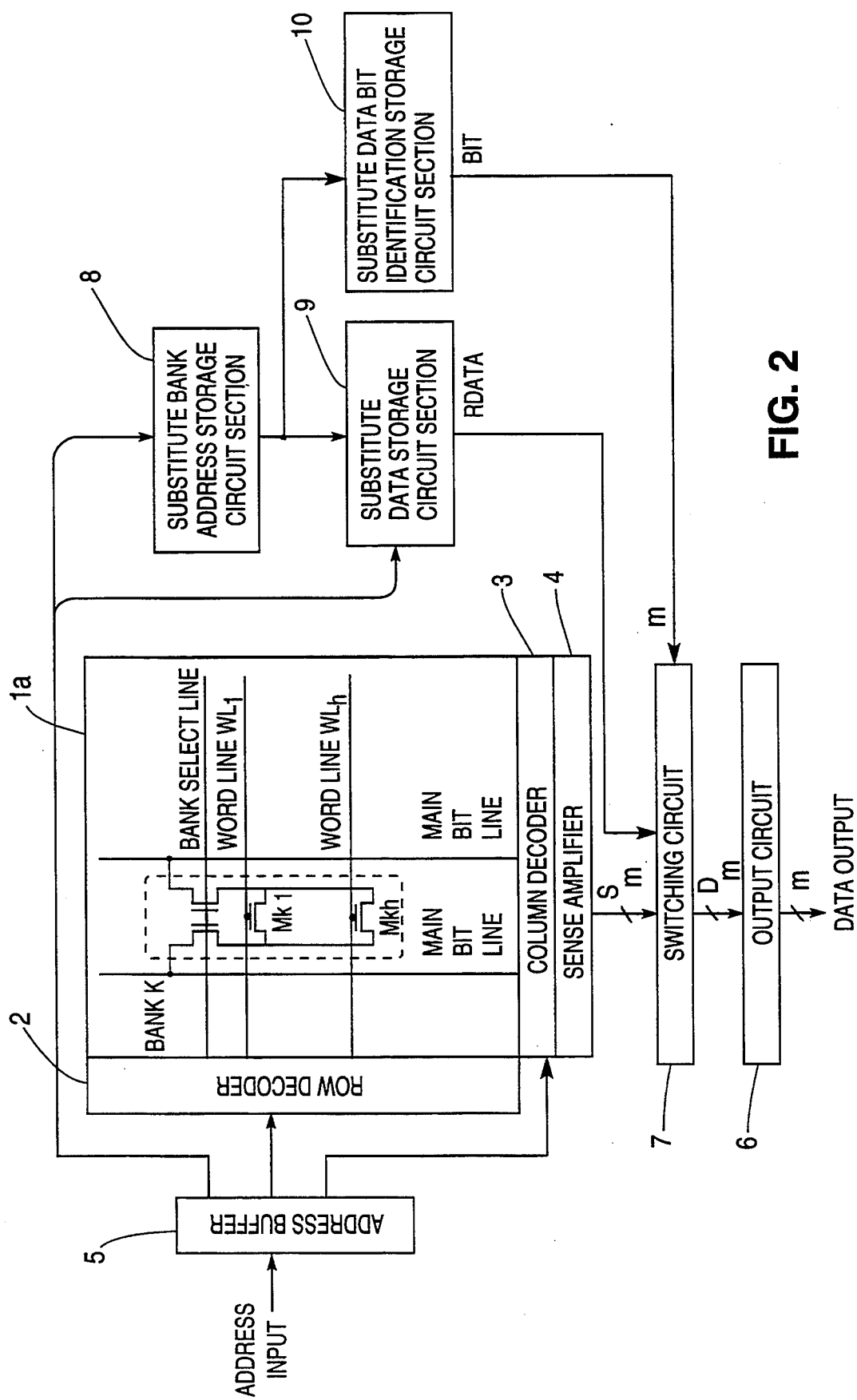
FIG. 2 shows the structure of the semiconductor read only memory according to the example.

FIG. 2 shows the structure of the semiconductor read only memory according to the present example. As is shown in FIG. 2, the semiconductor read only memory comprises the memory cell array 1a having a plurality of memory cells (the structure thereof is described above); an address buffer 5 for receiving an address input signal from the outside; a row decoder 2 and a column decoder 3 for selecting an arbitrary memory cell from among the plurality of memory cells in accordance with the address input signal; a sense amplifier 4 for reading out data from the selected memory cell; and an output circuit 6 for outputting data in accordance with a signal output from the sense amplifier 4.

The semiconductor read only memory further comprises a switching circuit 7 provided between the sense amplifier 4 and the output circuit 6; a substitute bank address storage circuit section 8; a substitute data storage circuit section 9; and a substitute data bit identification storage circuit section 10.

The address input signal is transmitted from the outside via the address buffer 5 to the row decoder 2 and the column decoder 3 for selecting an arbitrary memory cell in an arbitrary bank from among the memory cell array 1a. The address input signal is also input into the substitute bank address storage circuit section 8 and the substitute data storage circuit section 9 via the address buffer 5.

The substitute bank address storage circuit section 8 stores the address information of the bank including the defective memory cell. In accordance with the signal output from the substitute bank address storage circuit section 8, it is detected which bank should be substituted. The signal output from the substitute bank address storage circuit section 8 is transmitted to the substitute data storage circuit section 9 and to the substitute data bit identification storage circuit section 10.

The substitute data storage circuit section 9 thus receives the signal output from the substitute bank address storage circuit section 8, and then stores information for each memory cell of the bank to be substituted. On the other hand, the substitute data bit identification storage circuit section 10 receives the signal output from the substitute bank address storage circuit section 8, and then stores which one of the sense amplifiers (1 to m) will receive the address information on the defective bank to be read out from the memory cell array 1a.

The switching circuit 7 masks a signal output from the sense amplifier 4 when the defective bank is read out, in response to a signal (BIT) output from the substitute data bit identification storage circuit section 10. Thus, a signal ( RDATA ) output from the substitute data storage circuit section 9 rather than the signal output from the sense amplifier 4 is transmitted to the output circuit 6 via the switching circuit 7.

Figure 3:
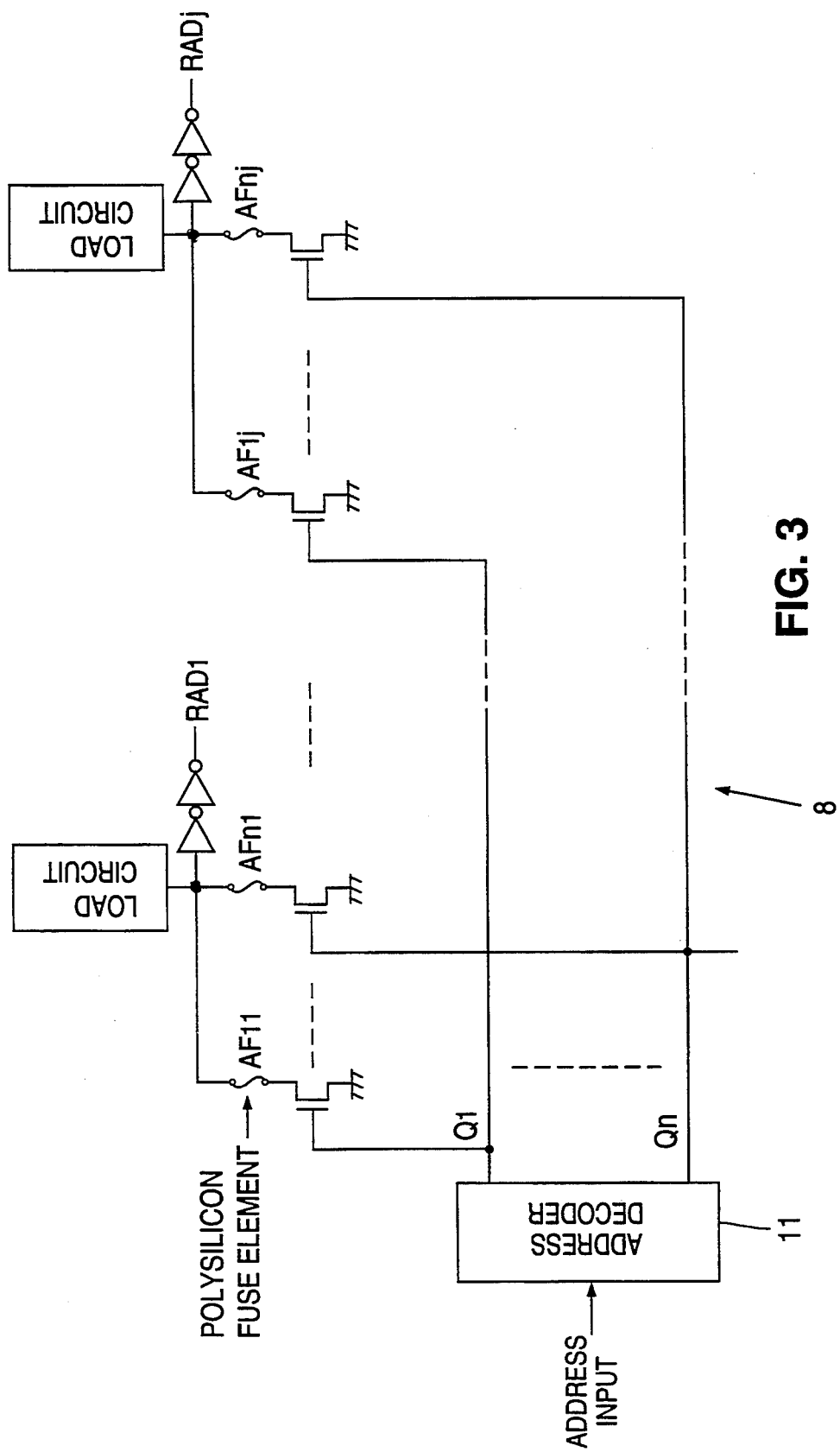
FIG. 3 shows the structure of a substitute bank address storage circuit according to the example.

FIG. 3 shows an exemplary structure for the substitute bank address storage circuit section 8 for storing address information on the defective bank including the defective memory cell. The substitute bank address storage circuit section 8 comprises an address decoder 11, a plurality of lines, and a plurality of transistors. The gate electrodes of the transistors are each connected to an output section of the address decoder 11 via the plurality of lines. One of the source and drain of each transistor is grounded, and the other of them is connected to an output terminal of the substitute bank address storage circuit section 8 via one of the polysilicon fuse elements ($AF_{11}$ to $AF_{n1}$, ..., and $AF_{1j}$ to $AF_{nj}$), and serially connected to two inverters. Decoded output signals $Q_1$ to $Q_n$ of the address decoder 11 are transmitted to the plurality of lines, respectively. Output signals $RAD_1$ to $RAD_j$ are output from the output terminals and then each transmitted to the substitute data storage circuit section 9 and to the substitute data bit identification storage circuit section 10.

When the address decoder 11 of the substitute bank address storage circuit section 8 receives the address signal to specify the bank, the address decoder 11 makes one of the decoded output signals $Q_1$ to $Q_n$ activated ("High" level). The transistor connected to the line to which the activated decoded output signal is transmitted becomes electrically conductive. As a result, each potential of the polysilicon fuse elements ($AF_{11}$ to $AF_{n1}$, ..., and $AF_{1j}$ to $AF_{nj}$) on the side of the transistor is reduced to the grounded level.

In cases where a bank in the memory cell array 1a become defective, in accordance with the bank address to specify the bank, the corresponding one of each polysilicon fuse element group ($AF_{11}$ to $AF_{n1}$, ..., and $AF_{1j}$ to $AF_{nj}$) is disconnected. Thus, the address information of the defective bank including the defective memory cell is stored.

Figure 4:
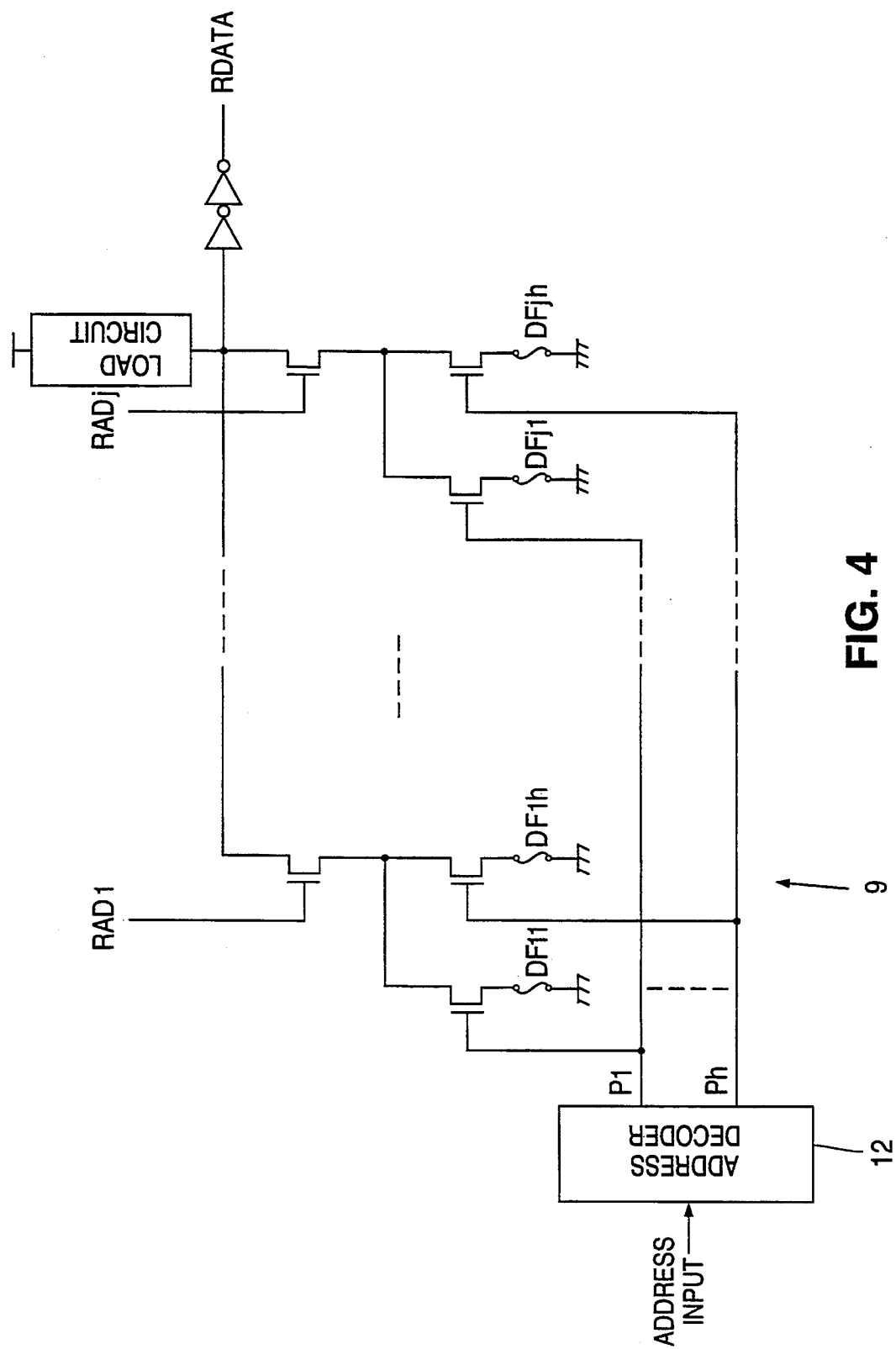
FIG. 4 shows the structure of a substitute data storage circuit according to the example.

FIG. 4 shows an exemplary structure for the substitute data storage circuit section 9. The substitute data storage circuit section 9 receives the address signal for selecting the defective memory cell from the address buffer 5, and signals $RAD_1$ to $RAD_j$ output from the substitute bank address storage circuit section 8. As is described above, the substitute data storage circuit section 9 stores information for each memory cell of the bank to be substituted. As is shown in FIG. 4, the substitute data storage circuit section 9 comprises an address decoder 12, a plurality of lines, and a plurality of first transistors. The gate electrodes of the first transistors are each connected to an output section of the address decoder 12 via the plurality of lines. One of the source and drain of each first transistor is grounded, and the other thereof is connected to an output terminal of the substitute data storage circuit section 9 via a second transistor and two serially connected inverters. Signals $P_1$ to $P_h$ output from the address decoder 12 are transmitted to the plurality of lines, respectively. Output signal RDATA is output from the output terminal. The output signals $RAD_1$ to $RAD_j$ of the substitute bank address storage circuit section 8 are applied to the gate electrodes of the second transistors, respectively.

In FIG. 4, in cases where a word line $WL_1$ (FIG. 2) is selected, the signal $P_1$ output from the address decoder 12 is activated ("High" level). On the other hand, in cases where a word line $WL_h$ (FIG. 2) is selected, the signal $P_h$ is activated ("High" level). Previously, the polysilicon fuse elements included in the substitute data storage circuit section 9 can selectively be disconnected in accordance with the information ("1" or "0") of memory cells $M_{k1}$ to $M_{kh}$ of a defective bank k (FIG. 2), so that information on each memory cell (substitute information) of the bank to be substituted can be stored.

For example, in cases where some defects occur in the memory cells $M_{k1}$ to $M_{kh}$ of the bank K, and the memory cell $M_{k1}$ is accessed, the signal $Q_k$ output from the address decoder 11 (FIG. 3) is activated ("High" level). In cases where the polysilicon fuse element $AF_{k1}$ is previously disconnected, the signal $RAD_1$ is activated ("High" level). In cases where a bank other than the bank K is accessed, the output signal $Q_k$ of the address decoder 11 is not activated, and thus the signal $RAD_1$ is not activated either, thereby preventing errors in the substitution operation. In cases where a memory cell $M_{k1}$ is selected from among memory cells $M_{k1}$ to $M_{kh}$, the signal $P_1$ output from the address decoder 12 (FIG. 4) is activated ("High" level). Therefore, information stored in the polysilicon fuse $DF_{11}$ is transmitted to the RDATA.

Figure 5:
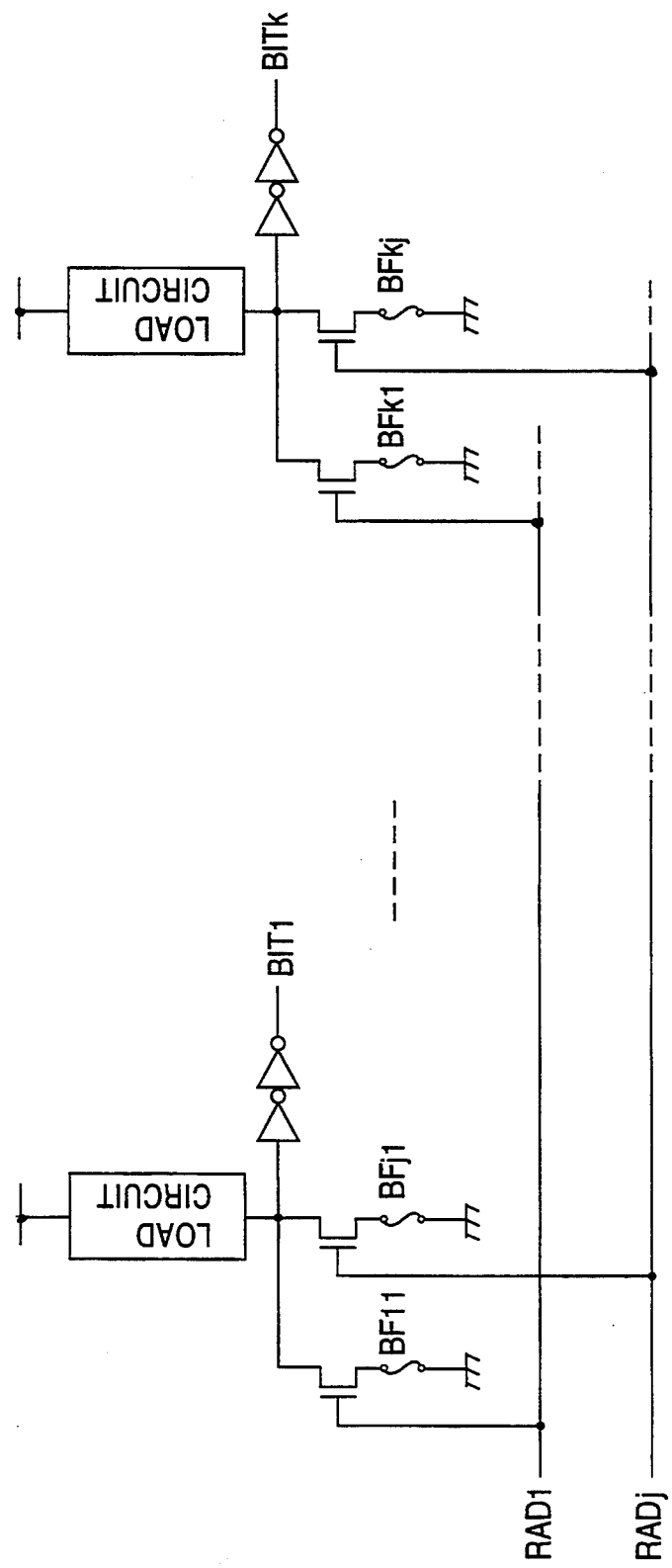
FIG. 5 shows the structure of a substitute data bit identification storage circuit according to the example.

FIG. 5 shows an exemplary structure for the substitute data bit identification storage circuit section 10. The substitute data bit identification storage circuit section 10 receives the signals $RAD_1$ to $RAD_j$ output from the substitute bank address storage circuit section 8. As is shown in FIG. 5, the substitute data bit identification storage circuit section 10 comprises a plurality of lines for receiving the signals $RAD_1$ to $RAD_j$, and a plurality of transistors whose gate electrodes are connected to the plurality of lines, respectively. One of the source and drain of each transistor is grounded via one of the polysilicon fuse elements ($BF_{11}$ to $BF_{j1}$, ..., and $BF_{k1}$ to $BF_{kj}$), and the other thereof is connected to an output terminal of the substitute data bit identification storage circuit section 10 via two serially connected inverters.

In order to identify a sense amplifier signal bit (1 to m) corresponding to the defective bank, one of each polysilicon fuse element group ($BF_{11}$ to $BF_{j1}$, ..., and $BF_{k1}$ to $BF_{kj}$) is previously disconnected. Accordingly, only one of the output signals $BIT_1$ to $BIT_m$ can be activated.

Figure 6:
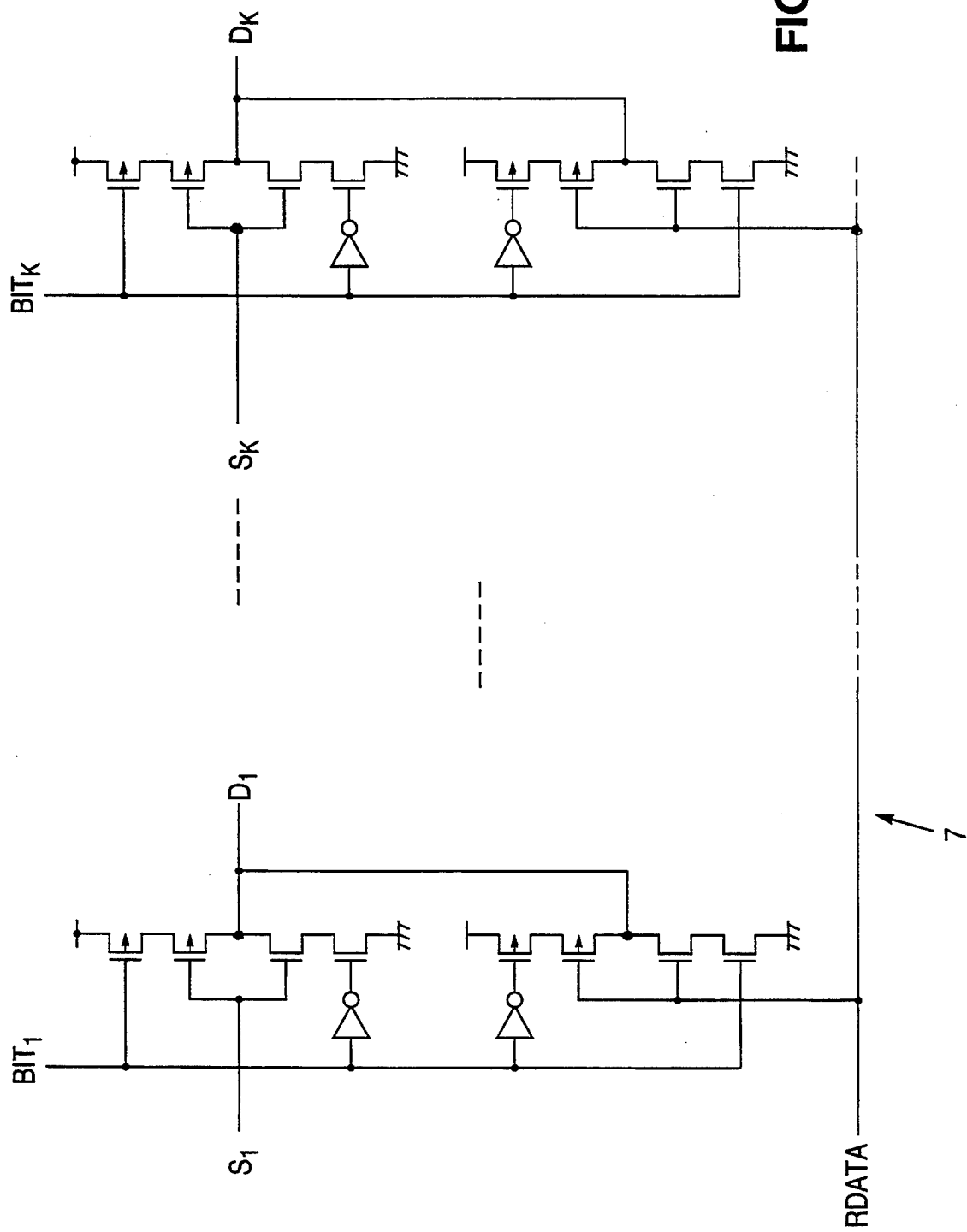
FIG. 6 shows the structure of a switching circuit according to the example.

FIG. 6 shows an exemplary structure for the switching circuit 7. The switching circuit 7 receives a sense amplifier signal $S_k$ output from the sense amplifier 4, an RDATA signal output from the substitute data storage circuit section 9, and a $BIT_k$ signal output from the substitute data bit identification storage circuit section 10. In accordance with the $BIT_k$ signal, the switching circuit 7 masks the sense amplifier signal $S_k$ of the defective memory cell information, and then outputs the RDATA signal output from the substitute data storage circuit section 9 as an output signal $D_k$ to the output circuit 6.

In cases where one of the other memory cells $M_{k2}$ to $M_{kh}$ included in the bank K (FIG. 1) is accessed, the same operation will be performed.

As is described above, in cases where several bits of memory cells become defective, all the information of normal memory cells connected to the line to which the defective memory cells are connected is not required to be written into each fuse element. Therefore, the number of fuse elements to be disconnected can greatly be reduced, resulting in remarkable reduction in the repair process time. Furthermore, the production yield can be improved because the percentage of success of disconnection by the laser light is improved. Thus, according to the present example, the production yield can be improved while almost maintaining the chip area and the process time for repairing defective memory cells.

Figure 7:
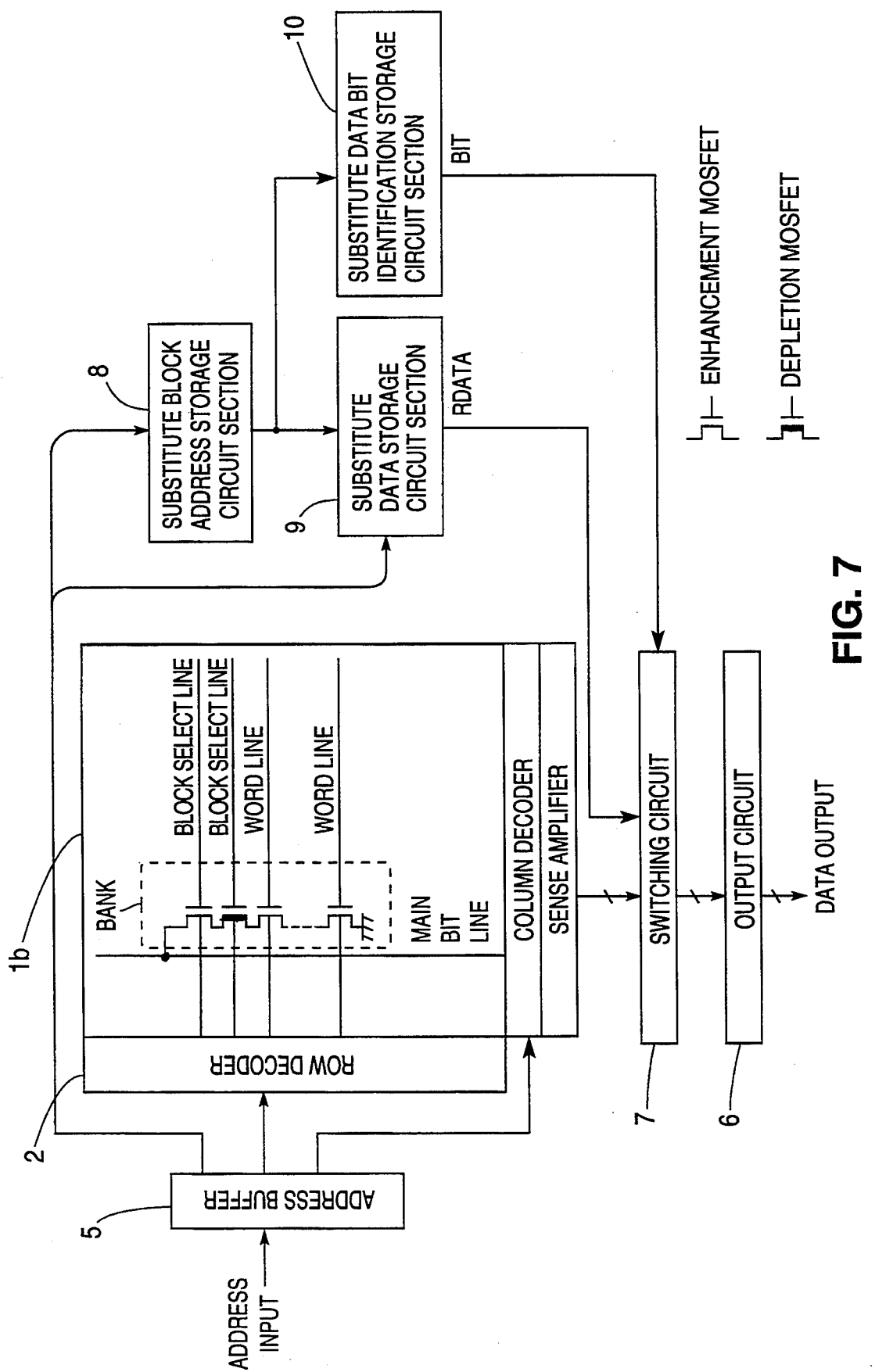
FIG. 7 shows a structure for a memory cell array of a semiconductor read only memory according to another example of the present invention.
Figure 8:
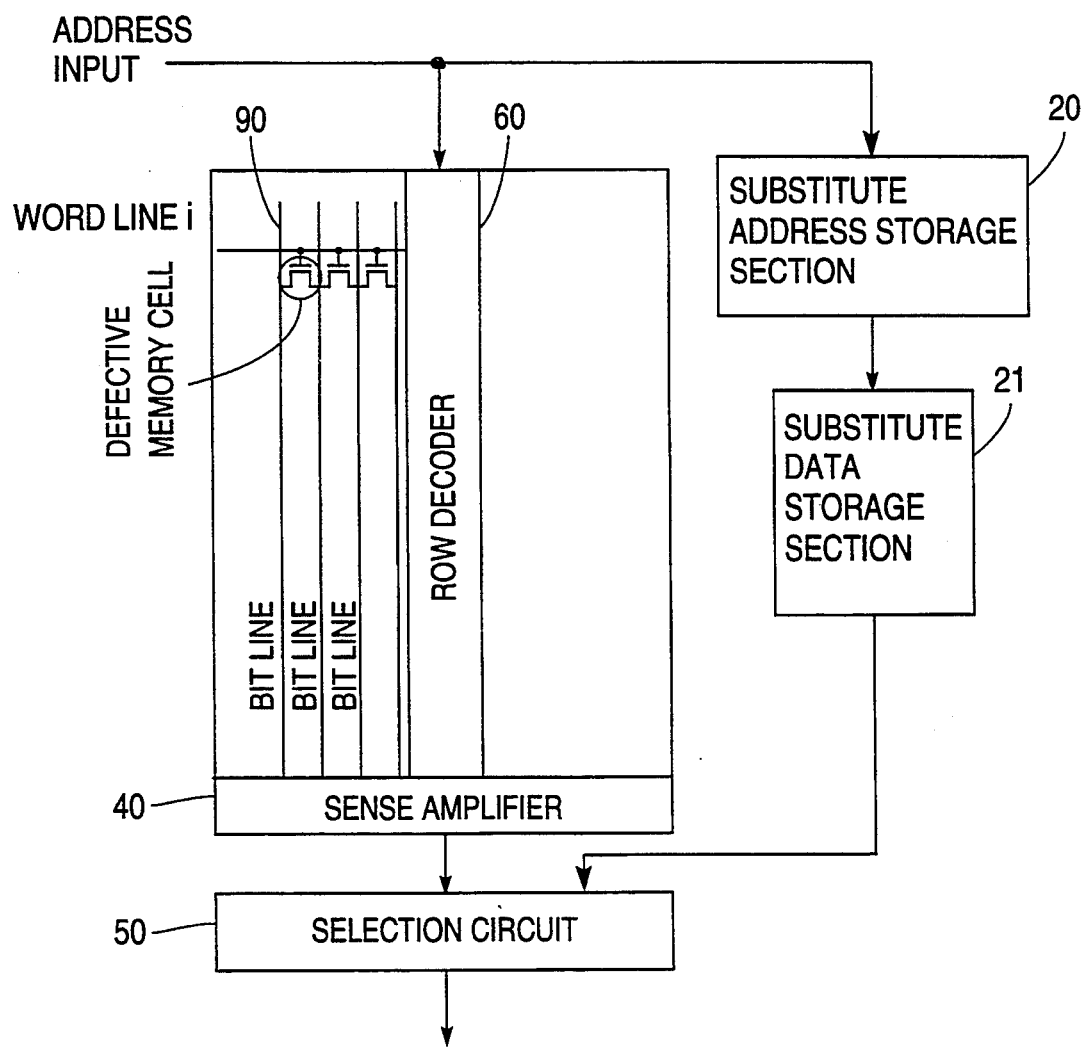
FIG. 8 shows a structure for a conventional mask ROM.

The present invention is not limited to a ROM having the memory cell array 1a shown in FIG. 1 but can be applied to a ROM having a memory cell array such as shown in FIG. 7. The memory cell array 1b is divided into a plurality of memory cell banks. Each of the memory cell banks includes a memory column in which a plurality of memory cells are connected in series, and select MOSFETs which are serially connected to the memory cell column. The memory cell banks are connected to an associated main bit line in parallel.

Furthermore, the method for disconnecting the fuse elements is not limited to the above mentioned method using laser light, but another method such as an electrical means can also be employed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor read only memory comprising:
   a memory cell array including a plurality of memory cell groups, said plurality of memory cell groups each including a plurality of memory cells;
   select means for selecting an arbitrary memory cell group from among said plurality of memory cell groups in response to an address input signal;
   address storage means for storing address information of a defective memory cell, the address storage means receiving an address input signal and outputting a group address signal of a memory cell group including the detective memory cell when the address input signal includes address information of the defective memory cell;
   data storage means for storing a plurality of data to be written into the memory cell group including the detective memory cell, the data storage means receiving the address input signal and the group address signal and reproducing one of the plurality of data in response to the address input signal and the group address signal; and
   bit identification storage means for storing bit line information of a defective memory cell, the bit identification storage means receiving the group address signal and outputting a sense amplifier bit signal in response to the group address signal;
   wherein the sense amplifier bit signal includes an information of a sense amplifier bit which is a sense amplifier receive defective group to be read out from the plurality of memory cell.

2. A semiconductor read only memory according to claim 1, wherein the semiconductor read only memory further includes switch means for receiving data of the memory cell, the one of the plurality of data and the sense amplifier bit signal, and the switch means masking the data of the memory cell in accordance with the sense amplifier bit signal.

3. A semiconductor read only memory comprising:
   a memory cell array including a plurality of memory cell banks, said memory cell array comprising a plurality of first lines and a plurality of second lines, said plurality of memory cell banks each including a plurality of memory cell MOS transistors provided between two adjacent first lines, portions of the respective two adjacent first lines forming source/drain regions of said plurality of MOS transistors;
   select means for selecting an arbitrary memory cell bank from among said plurality of memory cell banks by interconnecting the first lines to the second lines;
   address storage means for storing address information of a defective memory cell, the address storage means receiving an address input signal and outputting a bank address signal of a memory cell bank including the defective memory cell when the address input signal includes address information of the defective memory cell;
   data storage means for storing a plurality of data to be written into the memory cell bank including the defective memory cell, the data storage means receiving the address input signal and the bank address signal and reproducing one of the plurality of data in response to the address input signal and the bank address signal; and
   bit identification storage means for storing bit line information of a defective memory cell, the bit identification storage means receiving the bank address signal and outputting a sense amplifier bit signal in response to the bank address signal.

4. A semiconductor read only memory according to claim 3, wherein the address storage means has a plurality of fuse elements to be disconnected by laser light or electrical means, and stores the address information in accordance with the conductive or non-conductive state of each fuse element.

5. A semiconductor read only memory according to claim 3, wherein the data storage means has a plurality of fuse elements to be disconnected by laser light or electrical means, and stores the plurality of data in accordance with the conductive or non-conductive state of each fuse element.

6. A semiconductor read only memory according to claim 3, wherein the address storage means has a plurality of fuse elements to be disconnected by laser light or electrical means, and stores the address information in accordance with the conductive or non-conductive state of each fuse element; and the data storage means has a plurality of fuse elements to be disconnected by laser light or electrical means, and stores the plurality of data in accordance with the conductive or non-conductive state of each fuse element.

7. A semiconductor read only memory according to claim 3, wherein the semiconductor read only memory further includes switch means for receiving data of the memory cell, the one of the plurality of data and the sense amplifier bit signal, and the switch means masking the data of the memory cell in accordance with the sense amplifier bit signal.

8. A semiconductor read only memory comprising:
   a memory cell array including a plurality of memory cell banks, each of said plurality of memory cell banks comprising a memory cell column constituted by a plurality of memory cells connected in series and a plurality of bit lines connected to the memory cell column; and select means for selecting an arbitrary memory cell bank among said plurality of memory cell banks by interconnecting the bit line to the memory cell column;

address storage means for storing address information of a defective memory cell, the address storage means receiving an address input signal and outputting a bank address signal of a memory cell bank including the defective memory cell when the address input signal includes address information of the defective memory cell;

data storage means for storing a plurality of data to be written into the memory cell bank including the defective memory cell, the data storage means receiving the address input signal and the bank address signal and reproducing one of the plurality of data in response to the address input signal and the bank address signal; and bit identification storage means for storing bit line information of a defective memory cell, the bit identification storage means receiving the bank address signal and outputting a sense amplifier bit signal in response to the bank address signal.

9. A semiconductor read only memory according to claim 8, wherein the address storage means has a plurality of fuse elements to be disconnected by laser light or electrical means, and stores the address information in accordance with the conductive or non-conductive state of each fuse element.

10. A semiconductor read only memory according to claim 8, wherein the data storage means has a plurality of fuse elements to be disconnected by laser light or electrical means, and stores the plurality of data in accordance with the conductive or non-conductive state of each fuse element.

11. A semiconductor read only memory according to claim 8, wherein the address storage means has a plurality of fuse elements to be disconnected by laser light or electrical means, and stores the address information in accordance with the conductive or non-conductive state of each fuse element; and the data storage means has a plurality of fuse elements to be disconnected by laser light or electrical means, and stores the plurality of data in accordance with the conductive or non-conductive state of each fuse element.

12. A semiconductor read only memory according to claim 8, wherein the semiconductor read only memory further includes switch means for receiving data of the memory cell, the one of the plurality of data and the sense amplifier bit signal, and the switch means masking the data of the memory cell in accordance with the sense amplifier bit signal.

* * * * *

UNITED STATES PATENT AND TRADEMARK OFFICE
CERTIFICATE OF CORRECTION

PATENT NO. : 5,452,258

DATED : September 19, 1995

INVENTOR(S) : Yasuhiro Hotta et al.

It is certified that error appears in the above-identified patent and that said Letters Patent is hereby corrected as shown below:

In the drawings: Fig. 5 should be deleted and replaced with the corrected fig. 5.

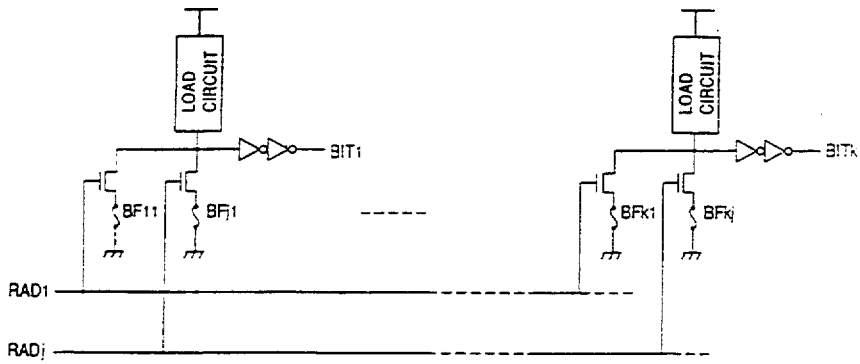

FIG. 5

UNITED STATES PATENT AND TRADEMARK OFFICE
CERTIFICATE OF CORRECTION

PATENT NO. : 5,452,258

DATED : September 19, 1995

INVENTOR(S) : Yasuhiro Hotta et al.

It is certified that error appears in the above-identified patent and that said Letters Patent is hereby corrected as shown below:

Replace with:

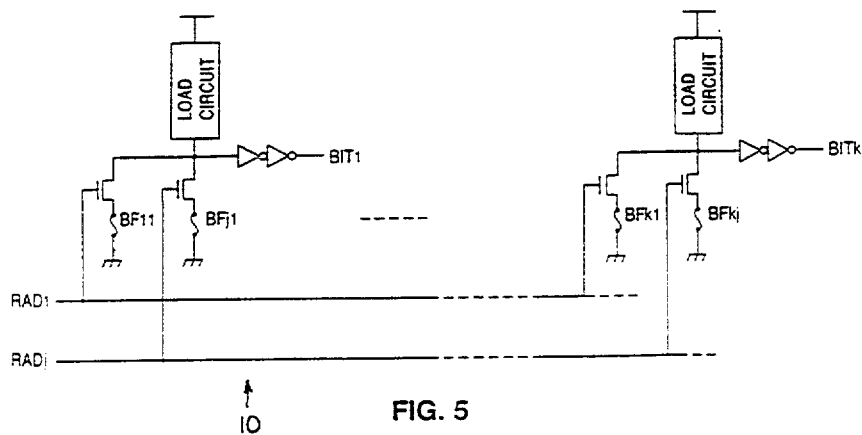

FIG. 5

Signed and Sealed this

Tenth Day of September, 1996

Attest:

*Bruce Lehman*

BRUCE LEHMAN

*Attesting Officer*  Commissioner of Patents and Trademarks